United States Patent
Waks

(10) Patent No.: US 11,018,717 B1
(45) Date of Patent: May 25, 2021

(54) SNAP-ON TRIAXIAL CABLE BALUN AND METHOD FOR TUNED TRAPPING OF RF CURRENT

(71) Applicant: Life Services, LLC, Minneapolis, MN (US)

(72) Inventor: Matthew T. Waks, Coon Rapids, MN (US)

(73) Assignee: Life Services, LLC, Minneapolis, MN (US)

( * ) Notice: Subject to any disclaimer, the term of this patent is extended or adjusted under 35 U.S.C. 154(b) by 57 days.

(21) Appl. No.: 16/535,045

(22) Filed: Aug. 7, 2019

Related U.S. Application Data

(60) Provisional application No. 62/715,538, filed on Aug. 7, 2018.

(51) Int. Cl.
| | |
|---|---|
| *H04B 3/30* | (2006.01) |
| *H04B 3/28* | (2006.01) |
| *H01B 11/18* | (2006.01) |
| *H03H 7/42* | (2006.01) |
| *H01R 4/2483* | (2018.01) |
| *H01R 9/05* | (2006.01) |
| *G01R 33/422* | (2006.01) |
| *H01R 43/01* | (2006.01) |
| *H01B 13/016* | (2006.01) |
| *H05K 9/00* | (2006.01) |
| *G01R 33/36* | (2006.01) |

(Continued)

(52) U.S. Cl.
CPC ........... *H04B 3/30* (2013.01); *G01R 33/3685* (2013.01); *G01R 33/422* (2013.01); *H01B 11/1895* (2013.01); *H01B 13/016* (2013.01); *H01R 4/2483* (2013.01); *H01R 9/0518* (2013.01); *H01R 43/01* (2013.01); *H01R 43/048* (2013.01); *H03H 3/00* (2013.01); *H03H 7/42* (2013.01); *H04B 3/28* (2013.01); *H05K 9/002* (2013.01)

(58) Field of Classification Search
CPC .......... H03H 1/0007; H03H 7/42; H03H 3/00; H04B 3/28; H04B 3/30
USPC ...... 333/12, 17, 17.1, 181, 25, 26, 206, 243, 333/245
See application file for complete search history.

(56) References Cited

U.S. PATENT DOCUMENTS

| | | | | |
|---|---|---|---|---|
| 4,004,257 A | * | 1/1977 | Geissler | H01P 1/15 333/207 |
| 5,076,799 A | * | 12/1991 | Virgo | H01R 9/0509 439/394 |

(Continued)

*Primary Examiner* — Rakesh B Patel
(74) *Attorney, Agent, or Firm* — Charles A. Lemaire; Jonathan M. Rixen; Lemaire Patent Law Firm, P.L.L.C.

(57) ABSTRACT

Apparatus and method for trapping RF on shields of a multiply shielded RF cable. In some embodiments, the RF trap shorts an outer conductor shield to an inner shield conductor of the cable successively at selected locations along an end length of the shield conductors. Some embodiments provide an RF-trap apparatus for blocking stray signals on a shielded RF cable that has two or more concentric peripheral shield conductors separated from one another by one or more electrically insulating layers, and at least one inner conductor for carrying RF signals. The RF trap apparatus includes: a first housing; and a plurality of projections configured be coupled to the first housing and to move to selectively electrically connect an outer shield conductor to an inner shield conductor by a pierce operation on the shielded RF cable.

20 Claims, 8 Drawing Sheets

(51) Int. Cl.
*H01R 43/048* (2006.01)
*H03H 3/00* (2006.01)

(56) References Cited

U.S. PATENT DOCUMENTS

| | | | |
|---|---|---|---|
| 5,449,206 | A | 9/1995 | Lockwood |
| 6,042,155 | A | 3/2000 | Lockwood |
| 6,495,069 | B1 | 12/2002 | Lussey et al. |
| 6,593,744 | B2 | 7/2003 | Burl et al. |
| 6,605,775 | B1 | 8/2003 | Seeber et al. |
| 6,664,465 | B2 | 12/2003 | Seeber et al. |
| 7,526,330 | B1 | 4/2009 | Randell et al. |
| 8,299,681 | B2 | 10/2012 | Snyder et al. |
| 8,604,791 | B2 | 12/2013 | Vaughan et al. |
| 8,854,042 | B2 | 10/2014 | Vaughan et al. |
| 9,097,769 | B2 | 8/2015 | Schillak et al. |
| 9,160,295 | B2 | 10/2015 | Waks et al. |

* cited by examiner

FIG. 3B1

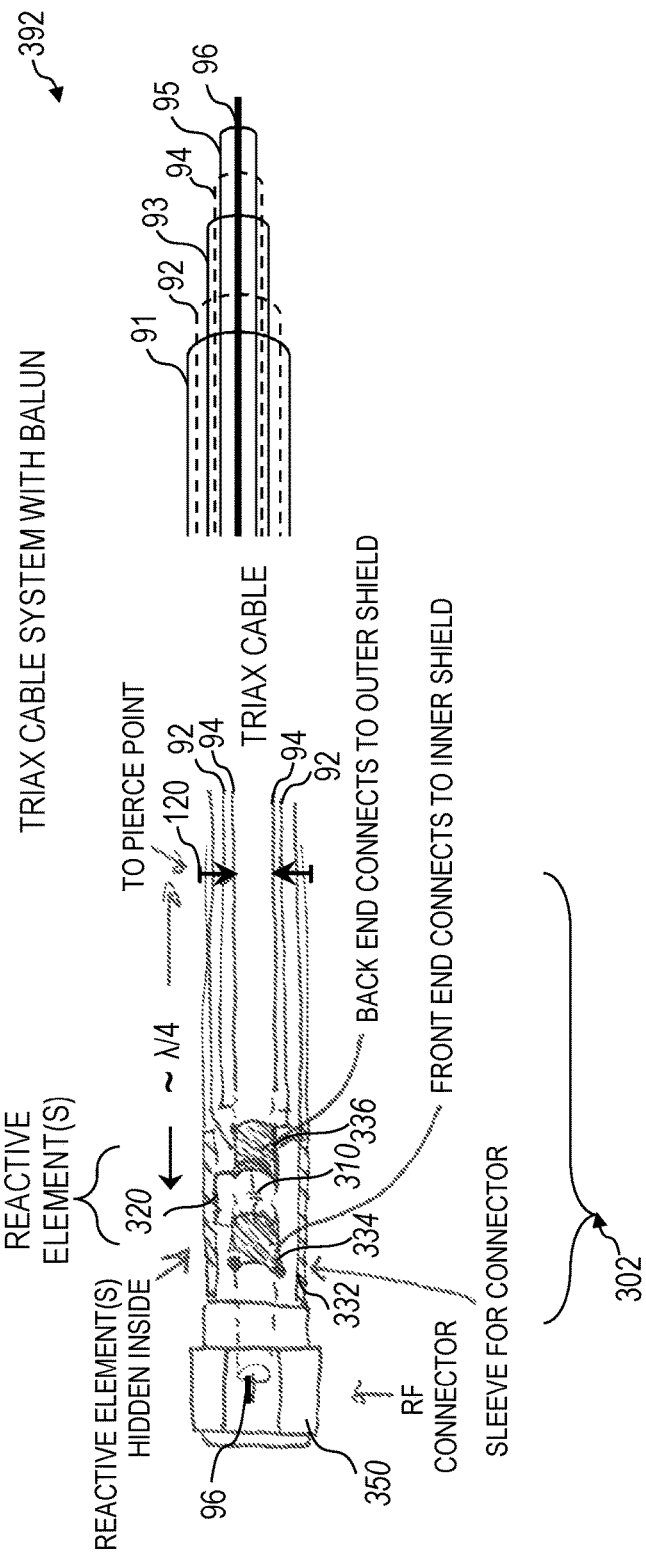
FIG. 3B2
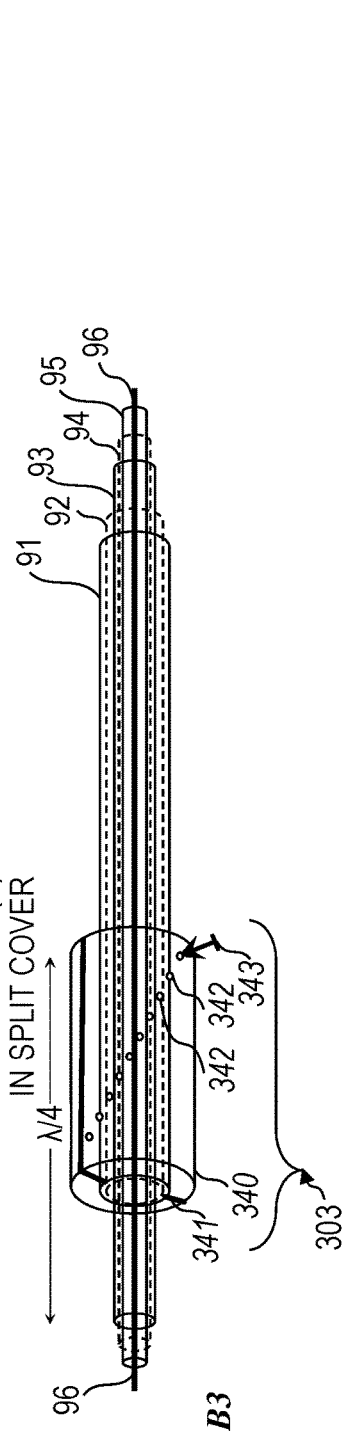
FIG. 3B3

IDEALLY THE CONNECTION BETWEEN THE INNER AND OUTER SHIELDS IS AT 1/4 WAVE ELECTRICALLY TO GENERATE THE HIGHEST IMPEDANCE TO BLOCK SHIELD CURRRENTS. BUT, WHEN ONE IS UNSURE WHERE $\lambda/4$ IS LOCATED, ONE CAN, USING THE PRESENT INVENTION, USE MULTIPLE CONNECTIONS BETWEEN SHIELDS ALONG THE LENGTH OF THE CABLE. THE CONNECTIONS CAN BE MADE SEQUENTIALLY WITH MEASUREMENTS MADE EACH TIME UNTIL THE DESIRED FREQUENCY RESPONSE IS ACHIEVED.

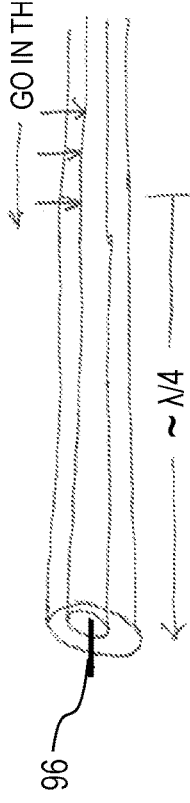

— GO IN THIS ORDER SO CLOSEST CONNECTION WOULD BE @ $\lambda/4$.

*FIG. 3C1*

\* CONTACTS COULD/WOULD BE DISPERSED RADIALLY AROUND TRIAX IN ALL METHODS

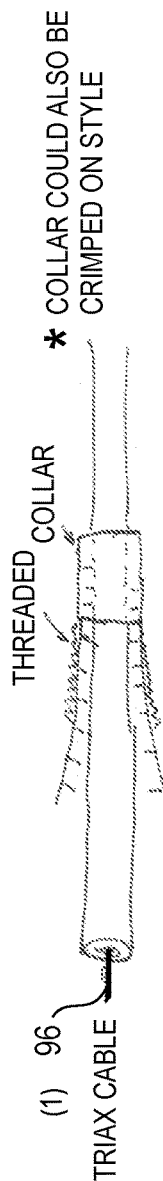

\* COLLAR COULD ALSO BE CRIMPED ON STYLE

*FIG. 3C2* TRIAX CABLE (1) THIS TECHNIQUE COULD BE FABRICATED MANY WAYS

THIS COULD BE A COLLAR ON THE OUTSIDE OF TRIAX CABLE THAT THREADS OVER A SLEEVE OF CONTACTS, AND AS COLLAR MOVES ALONG THREADS, IT IS DRIVING IN THE INS-DISP. CONTACTS TO ADJUST FREQ.

(2) COULD SNAP ON LIKE OUR PRIOR ART, & FERRITE BEADS (3) ALSO, COULD BE MORE OF A SOLID SLEEVE W/ THREADED HOLE ALONG THE LENGTH OF CABLE TO INSERT INS-DISP. SCREWS

THREADED HOLES FOR SCREW CONTACTS

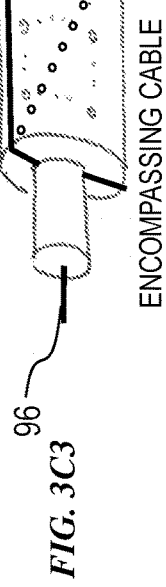

\* OR THE SCREWS COULD PRESS IN AN INNER CONTACT LAYER INSTEAD OF BEING THE CONTACT, COULD BE A SLEEVE OF CONTACTS THEN A SLEEVE SLIDES OVER IT WITH HOLES FOR SCREWS

*FIG. 3C3* ENCOMPASSING CABLE

BAZOOKA BLAUN LINK: WWW.ANTENNA-THEORY.COM/DEFINITIONS/BAZOOKA.PHP OR ONE CAN GOOGLE "BAZOOKA BALUN" AND SEE PLENTY OF IMAGES SHOWING THE APPLICATION OF AN OUTER METAL SLEEVE BEING CONNECTED TO THE ORIGINAL COAX SHIELD AT 1/4 WAVE; LIKE THE FOLLOWING FIGURE SHOWS. THE BAZOOKA BALUN IS AN OLD TECHNIQUE THAT IS DISPLAYED IN THE ARRL HANDBOOK. THE NEW INVENTION USES AN ARBITRARILY LONGER SLEEVE, AND THE INSULATION-DISPLACEMENT OR SOLDER CONNECTION AT 1/4 WAVE

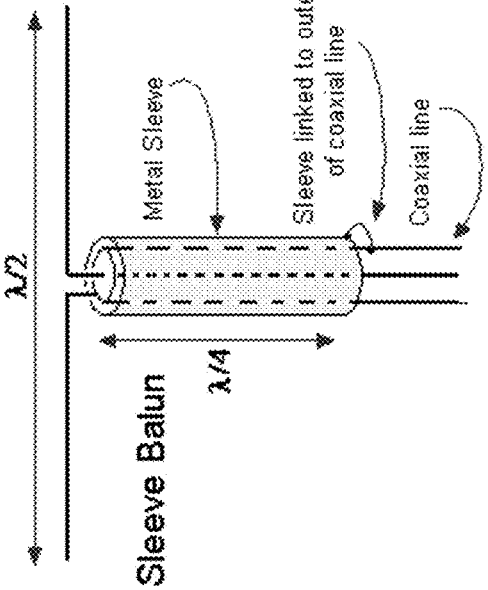

*FIG. 3E    (PRIOR ART)*

THE INVENTOR HAS DEMONSTRATED ON THE BENCH THAT THE OUTER SLEEVE CAN BE ESSENTIALLY ARBITRARILY LONG AND STILL WORK, AS LONG AS THE SLEEVE IS ATTACHED AT THE APPROPRIATE 1/4-WAVE POSITION (OR ANY ADDITIONAL 1/2 WAVE POSITION BEYOND THAT: 1/4, 3/4, 5/4, 7/4-WAVE ...) PICTURES OF MY EXPERIMENTS ARE ATTACHED. ONE IMAGE SHOWS THE SHORT 1/4 WAVE TRAP, THE OTHER FILE SHOWS A LONGER OUTER SLEEVE, SOLDERED AT THE 1/4 WAVE POSITION; IN BOTH IMAGES YOU CAN SEE THE SMITH CHART MEASUREMENTS OF THE TRAP. THE YELLOW ARC TRACE ON THE NETWORK ANALYZER IS SHOWING IMPEDANCE IN COMPLEX FORM, THE LEFT SIDE OF THE ARC IS HIGH IMPEDANCE.

SMITH CHART MEASUREMENTS FOR BOTH TRAPS, SHORT VS. LONG (SOLDERED AT 1/4 WAVE), DEMONSTRATE SIMILAR RESULTS. IN SOME EMBODIMENTS, AN INSULATION-DISPLACEMENT CONNECTOR IS USED TO STAB INTO TRIAX CABLE AT THE 1/4-WAVE LOCATION TO MAKE THIS CONNECTION. THIS IS SIMILAR TO U.S. PATENT 9,160,295, BUT OPEN ENDED. IN SOME EMBODIMENTS, THE OPEN END OF THE BAZOOKA BALUN IS SHORTENED OR LENGTHENED AND THEN SOME REACTANCE (CAP OR INDUCTOR) IS ADDED ACROSS THE GAP FROM THE OUTER SLEEVE TO THE COAX SHIELD.

SNAP-ON TRIAXIAL CABLE BALUN AND METHOD FOR TUNED TRAPPING OF RF CURRENT

CROSS-REFERENCE TO RELATED APPLICATIONS

This application claims priority benefit, under 35 U.S.C. § 119(e), of U.S. Provisional Patent Application 62/715,538, filed Aug. 7, 2018 by Matthew T. Waks and titled "Snap-on triaxial cable balun and method for tuned trapping of RF current," which is incorporated herein by reference in its entirety.

This application is related to U.S. patent application Ser. No. 15/363,852 filed on Nov. 29, 2016 by Matthew T. Waks et al., titled "BALUN FOR TRAPPING RF CURRENT ON A TRANSMISSION LINE" (which issued as U.S. Pat. No. 10,200,006 on Feb. 5, 2019), which is a divisional of U.S. patent application Ser. No. 15/000,796 filed on Jan. 19, 2016 by Matthew T. Waks et al., titled "METHOD AND BALUN FOR TRAPPING RF CURRENT ON A TRANSMISSION LINE AFTER INSTALLATION" (which issued as U.S. Pat. No. 9,509,271 on Nov. 29, 2016), which is a divisional of U.S. patent application Ser. No. 14/881,154 filed on Oct. 13, 2015 by Matthew T. Waks et al., titled "SNAP-ON COAXIAL CABLE BALUN AND METHOD FOR TRAPPING RF CURRENT ON OUTSIDE SHIELD OF COAX AFTER INSTALLATION" (which issued as U.S. Pat. No. 9,240,765 on Jan. 19, 2016), which is a divisional of U.S. patent application Ser. No. 13/831,752 filed on Mar. 15, 2013 by Matthew T. Waks et al., titled "SNAP-ON COAXIAL CABLE BALUN AND METHOD FOR TRAPPING RF CURRENT ON OUTSIDE SHIELD OF COAX AFTER INSTALLATION" (which issued as U.S. Pat. No. 9,160,295 on Oct. 13, 2015), each of which is incorporated herein by reference in its entirety.

FIELD OF THE INVENTION

This invention relates to the field of radio-frequency balance/unbalance ("balun") circuitry and more specifically to a method and RF-trap apparatus that can be built-on before the cable is terminated, affixed or soldered to a termination (such as an end connector, radio-frequency (RF) antenna or magnetic-resonance imaging (MRI) coil), or can be attached and/or fabricated to an installed triaxial cable from a side rather than from over an end at the termination, and, in some embodiments, can be adjusted for the cable's electrical characteristics once the cable is electrically and/or mechanically attached to the termination.

BACKGROUND OF THE INVENTION

As used herein, the term "balun" refers to a radio-frequency (RF) cable trap that blocks stray RF current from flowing on the outside of shield conductors of coaxial RF cables.

U.S. Pat. No. 9,160,295 to Waks et al. issued on Oct. 13, 2015 with the title "SNAP-ON COAXIAL CABLE BALUN AND METHOD FOR TRAPPING RF CURRENT ON OUTSIDE SHIELD OF COAX AFTER INSTALLATION" and is incorporated herein by reference. U.S. Pat. No. 9,160,295 describes an apparatus and method for a radially attachable radio-frequency (RF) trap attached from a side to a shielded coax cable. In some embodiments, the RF trap creates a high impedance on the outer shield of the RF cable at a frequency of RF signals carried on at least one inner conductor of the cable. In some embodiments, an RF-trap apparatus for blocking stray signals on a shielded RF cable that has a peripheral shield conductor and an inner conductor for carrying RF signals includes: a case; an LC circuit having a resonance frequency equal to RF signals carried on the inner conductor; projections that pierce and connect the LC circuit to the shield conductor; and an attachment device that holds the case to the cable with the LC circuit electrically connected to the shield conductor of the shielded RF cable.

U.S. Pat. No. 6,605,775 to Seeber et al. issued Aug. 12, 2003 with the title "FLOATING RADIO FREQUENCY TRAP FOR SHIELD CURRENTS" and is incorporated herein by reference. Seeber et al. describe a floating shield current trap that provides first and second concentric tubular conductors electrically connected to provide a resonance-induced high impedance of current flow in a path consisting of the inner and outer conductors and their junctions thereby suppressing coupled current flow on a shield of a conductor contained within the first inner tubular conductor.

U.S. Pat. No. 6,664,465 to Seeber issued Dec. 16, 2003 with the title "Tuning system for floating radio frequency trap" and is incorporated herein by reference. Seeber describes a floating shield current trap provides two resonance loops formed of split concentric tubular conductors joined radially at their axial ends. Adjustment of the separation of these loops provides a change in coupling between the loops effecting a simplified tuning of the resonance of the trap for different expected frequencies of interfering shield current.

U.S. Pat. No. 6,593,744 to Burl et al. issued Jul. 15, 2003 with the title "Multi-channel RF cable trap for magnetic resonance apparatus" and is incorporated herein by reference. Burl et al. describe a multi-channel RF cable trap that blocks stray RF current from flowing on shield conductors of coaxial RF cables of a magnetic resonance apparatus. An inductor is formed by a curved semi-rigid trough constructed of an insulating material coated with an electrically conducting layer. Preferably, the inductor and the cable follow an "S"-shaped path to facilitate good electromagnetic coupling. The RF cables are laid in the trough and the shield conductors inductively couple with the inductor. A capacitor and optional trim capacitor are connected across the trough of the inductor to form a resonant LC circuit tuned to the resonance frequency. The LC circuit inductively couples with the shield conductors to present a signal-attenuating high impedance at the resonance frequency. The resonant circuit is preferably contained in an RF-shielding box with removable lid.

Conventional electrical components that permitted one to vary resistance, inductance, and/or capacitance under electrical control typically have somewhat limited component values available and are not compatible with being located in high fields (e.g., the fields of 1 tesla or more that are typically found in high-energy physics experiments such as the $9-billion Large Hadron Collider that has been 20 years in making and is still being modified to be able to operate).

Low-power circuits can use varactors (electrically variable capacitors), field-effect transistors (used as variable gain elements or variable resistors) and like components that are directly electrically-adjustable, for use in adjusting frequency, impedance or other circuit characteristics and parameters, however such components are often unsuitable or inoperative in high fields.

U.S. Pat. No. 6,495,069 issued Dec. 17, 2002 to Lussey et al. with the title "Polymer composition" and is incorporated herein by reference. Lussey et al. describe a polymer composition comprises at least one substantially non-conductive polymer and at least one electrically conductive filler and in the form of granules. Their elastomer material was proposed for devices for controlling or switching electric current, to avoid or limit disadvantages such as the generation of transients and sparks which are associated with the actuation of conventional mechanical switches. They described an electrical conductor composite providing conduction when subjected to mechanical stress or electrostatic charge but electrically insulating when quiescent comprising a granular composition each granule of which comprises at least one substantially non-conductive polymer and at least one electrically conductive filler and is electrically insulating when quiescent but conductive when subjected to mechanical stress. They did not propose a means for electrically activating such switches.

U.S. Pat. No. 8,299,681 to Snyder, Vaughan and Lemaire issued Oct. 30, 2012 with the title "Remotely adjustable reactive and resistive electrical elements and method" and is incorporated herein by reference. Snyder, Vaughan and Lemaire describe an apparatus and method that includes providing a variable-parameter electrical component in a high-field environment and based on an electrical signal, automatically moving a movable portion of the electrical component in relation to another portion of the electrical component to vary at least one of its parameters. In some embodiments, the moving uses a mechanical movement device (e.g., a linear positioner, rotary motor, or pump). In some embodiments of the method, the electrical component has a variable inductance, capacitance, and/or resistance. Some embodiments include using a computer that controls the moving of the movable portion of the electrical component in order to vary an electrical parameter of the electrical component. Some embodiments include using a feedback signal to provide feedback control in order to adjust and/or maintain the electrical parameter. Some embodiments include a non-magnetic positioner connected to an electrical component configured to have its RLC parameters varied by the positioner.

Conventional baluns are unitary structures that are slipped over an end of a cable and then soldered in place. This makes it difficult and inconvenient to install such a balun once both ends of the cable are connectorized and/or soldered in place.

There is a long-felt need for an RF cable trap that is adjustable for frequency and can be installed on a cable from the side and that blocks stray RF current from flowing on shield conductors of RF cables.

SUMMARY OF THE INVENTION

The present invention provides a cable balun and method for tunable trapping of RF current on the outside and/or an inner shield of triax after the cable is installed. In some embodiments, the ends of an inner signal conductor and an inner shield of the triax cable are electrically connected to the RF termination (such as an end connector, an radio-frequency (RF) antenna or a magnetic-resonance imaging (MRI) coil element), while the end of the outer shield not electrically connected to the termination, and a device (which is optionally adjustable) is provided for the outer shield to be electrically connected (shorted) to an inner shield at an electrical distance of one-quarter wavelength (optionally plus an integer (e.g., 0, 1, 2, . . . ) multiple of one-half wavelength) from its end. Some embodiments provide an RF-trap apparatus for blocking stray signals on a shielded RF cable that has two or more concentric peripheral shield conductors separated from one another by one or more electrically insulating layers, and at least one inner conductor for carrying RF signals. The RF trap apparatus includes: a first housing; and a plurality of projections configured be coupled to the first housing and to move to selectively electrically connect an outer shield conductor to an inner shield conductor by a pierce operation on the shielded RF cable.

In some embodiments, one or more reactive elements of the snap-on balun of the present invention include adjustable parameters (e.g., capacitance and/or inductance) that are adjusted electrically. In other embodiments, the adjustable parameters (e.g., capacitance and/or inductance) are adjusted mechanically using electrically controlled actuators. In some embodiments, these electrically controlled mechanical-movement devices (such as piezo-electrical linear motors, micro-electronic mechanical-system (MEMS) mechanical actuators or MEMS pumps) and other elements (which are used to make the resistors, inductors, capacitors, and/or antenna elements) include metals that have only substantially non-magnetic components such that the resistors, inductors, capacitors, robotic arms or similar mechanical devices, and/or antenna elements and the mechanical positioner(s) or pump(s) that adjust their variable values can be placed and operated within and/or near an extremely high electric field of many thousands of volts per meter (such as connected to or affecting electricity-transmission lines carrying hundreds of thousands of volts and very large currents), or extremely-high magnetic field such as within the very strong superconducting-wire magnets of high-energy particle-physics experiments (such as the Large Hadron Collider) or within magnets of a magnetic-resonance imaging machines, or during and after an electromagnetic pulse (EMP) from a nuclear event.

In other embodiments, the present invention provides the ability to adjust very sensitive circuits that do not involve high fields, but instead involve very low fields (such as within completely enclosed Faraday cages (which block low-frequency external fields) having radio-frequency (RF) shielding (which block high-frequency external fields) that are measuring very small parameters such as extremely low-voltage circuits where the presence of a person or magnetic mechanical movement device (such as a magnetic linear positioner, rotary motor, or pump) would change the field, but which use the mechanical movement device(s) to adjust the configuration of RLC (resistive-inductive-capacitive) components without modifying fields or introducing extraneous capacitances or inductances.

BRIEF DESCRIPTION OF THE DRAWINGS

FIG. 3B1 is a block diagram of an RF trap system 391 that uses an RF trap apparatus 301 on a shielded cable 99, according to some embodiments of the present invention.

FIG. 3B2 is a block diagram of an RF trap system 392 that uses an RF trap apparatus 302 on a shielded cable 99, according to some embodiments of the present invention.

FIG. 3B3 is a block diagram of an RF trap system 393 that uses an RF trap apparatus 303 on a shielded cable 99, according to some embodiments of the present invention.

FIGS. 3C1, 3C1 and 3C3 provide a description and drawings of the present invention, according to some embodiments of the present invention.

FIG. 3E is a description and drawings of prior-art and support for the present invention, according to some embodiments of the present invention.

DESCRIPTION OF PREFERRED EMBODIMENTS

Although the following detailed description contains many specifics for the purpose of illustration, a person of ordinary skill in the art will appreciate that many variations and alterations to the following details are within the scope of the invention. Specific examples are used to illustrate particular embodiments; however, the invention described in the claims is not intended to be limited to only these examples, but rather includes the full scope of the attached claims. Accordingly, the following preferred embodiments of the invention are set forth without any loss of generality to, and without imposing limitations upon the claimed invention. Further, in the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. The embodiments shown in the Figures and described here may include features that are not included in all specific embodiments. A particular embodiment may include only a subset of all of the features described, or a particular embodiment may include all of the features described.

The leading digit(s) of reference numbers appearing in the Figures generally corresponds to the Figure number in which that component is first introduced, such that the same reference number is used throughout to refer to an identical component which appears in multiple Figures. Signals and connections may be referred to by the same reference number or label, and the actual meaning will be clear from its use in the context of the description.

As used herein, a non-magnetic mechanical movement device is any electrically-controlled device (such as a linear positioner, rotary motor, or pump) made of materials that do not move (or move to a substantially negligible amount) due to a high magnetic field when subjected to the high magnetic field. Such devices can be placed within the high magnetic field of a magnetic-resonance machine or the superconducting magnet of a particle accelerator without the danger of the device moving due to the magnetic field and/or without the undesirable result of changing the magnetic field due to their presence. In many of the descriptions herein, the term "motor" (such as motor 140) will be used as an example of such a non-magnetic mechanical movement device, however one of skill in the art will recognize that in other embodiments, the "motor" can be implemented as a linear or rotary motor device using suitable linkages, or as a pump that uses a liquid or pneumatic fluid to effectuate the described movement.

Figure 1A:
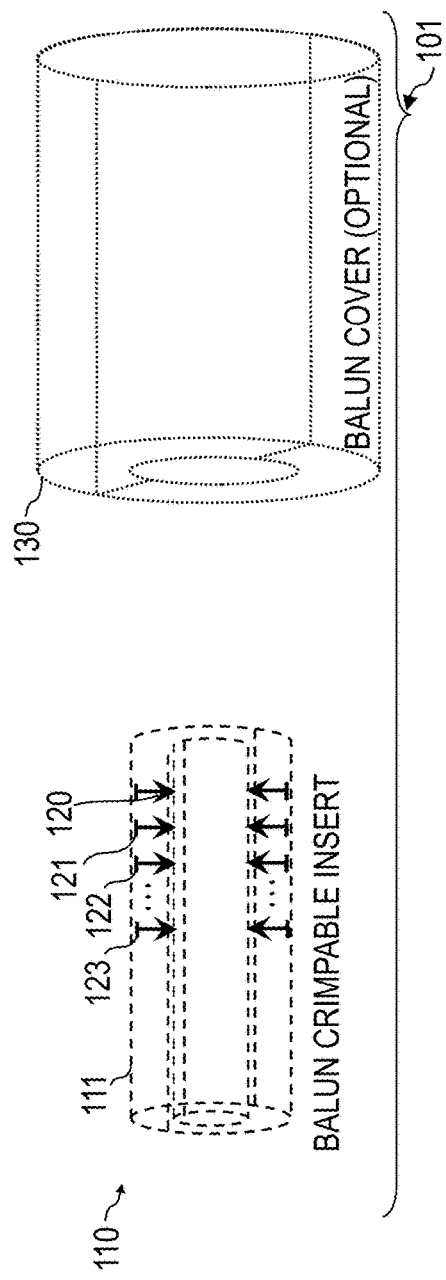
FIG. 1A is a block diagram of RF trap apparatus kit 101, according to some embodiments of the present invention.

FIG. 1A is a block diagram of RF trap apparatus kit 101, according to some embodiments of the present invention. In some embodiments, kit 101 includes a crimpable balun insert 110 that includes a plurality of withdrawn piercing electrically conductive projections 120, 121, 122, . . . 123 held in a deformable insulator 111. By fitting crimpable balun insert 110 over triax cable 99 (see FIG. 1B) and squeezing a portion of crimpable balun insert 110 with a crimping tool (such as a pliers or other suitable tool) at selected locations, a conductive path is formed between the outer shield 92 and the inner shield 94 of triax cable 99. When this electrical connection is made at a length of ¼ wavelength (optionally plus an integer number of ½ wavelengths), stray RF currents are trapped in the end portion of the outer shield (to the left of the connection 120' of FIG. 1C. By providing a plurality of such projections 120, 121, 122, . . . 123 at different positions from the end of the outer shield 92 of triax cable 99, a user can successively crimp additional projections 121, 122, . . . 123, forming electrical shorts at progressively different (shorter) lengths from the end of the outer shield 92, thus adjusting the electrical length of that end section until it is at the correct ¼ wavelength (as that wavelength is seen in the cable outer shield) of the RF frequency of interest.

Figure 1B:
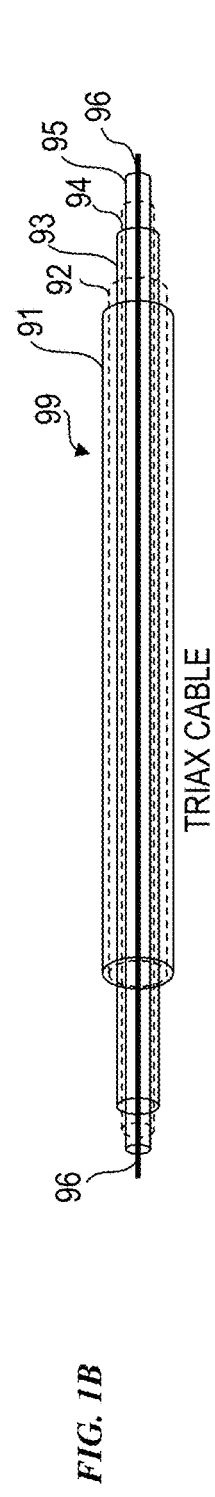
FIG. 1B is a block diagram of a triax shielded cable 99.

FIG. 1B is a block diagram of triax cable 99 that can be used with device 110 to form a balun 191 (see FIG. 1C), according to some embodiments of the present invention.

Figure 1C:
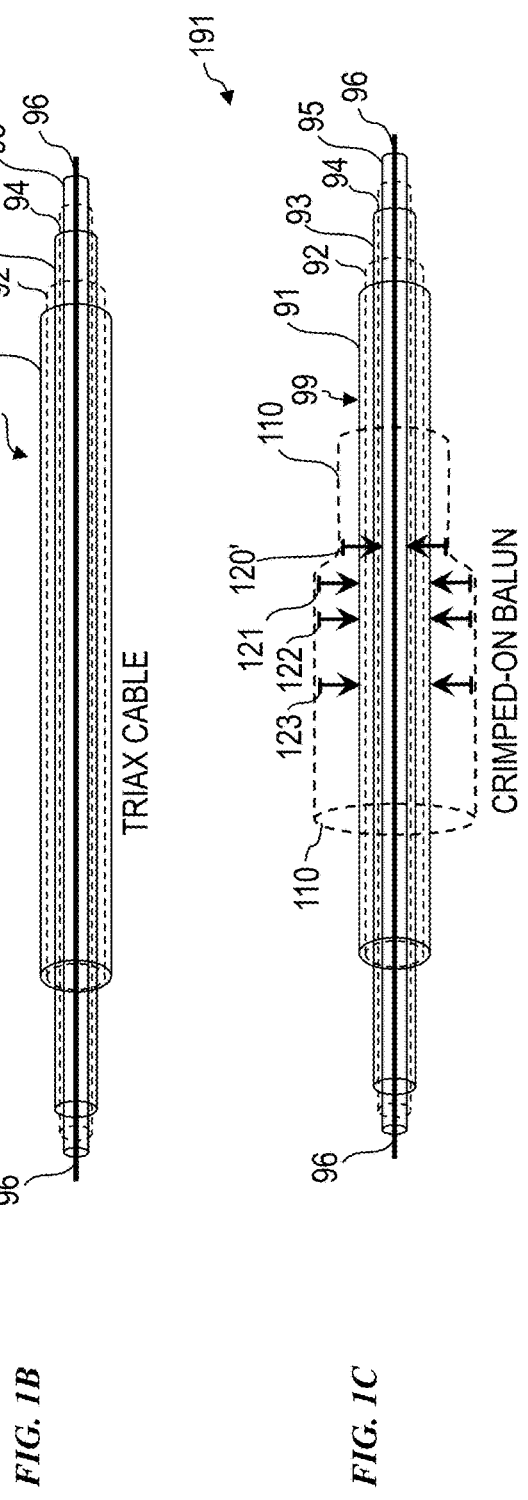
FIG. 1C is a block diagram of an RF trap system 191 that uses an RF trap apparatus kit 101 on a shielded cable 99, according to some embodiments of the present invention.

FIG. 1C is a block diagram of an RF trap system balun 191 that uses an RF trap apparatus 101 on a shielded cable 99, according to some embodiments of the present invention. In some embodiments, cable 99 includes one or more inner conductors 96 covered with insulator layer 95, and an inner conductive shield 94 surrounding the insulator layer 95, an intermediate insulator layer 93 surrounding inner conductive shield 94 and surrounded by outer shield 92, and an outer insulator layer 91 surrounding the outer shield 92. In some embodiments, RF trap 101 includes a plurality of possible connections (projections 120, 121, 122, . . . 123), where shown here in FIG. 1C connections from projections 120' have been made by crimping those connectors, but not yet crimping projections 121, 122, . . . 123. If the initial connection(s) via projections 120 are not short enough (i.e., close enough to the left-hand end) to be at ¼ wavelength, then the user will crimp through additional projections (crimping projections 121, 122, . . . 123), until the proper length is determined.

Figure 1D:
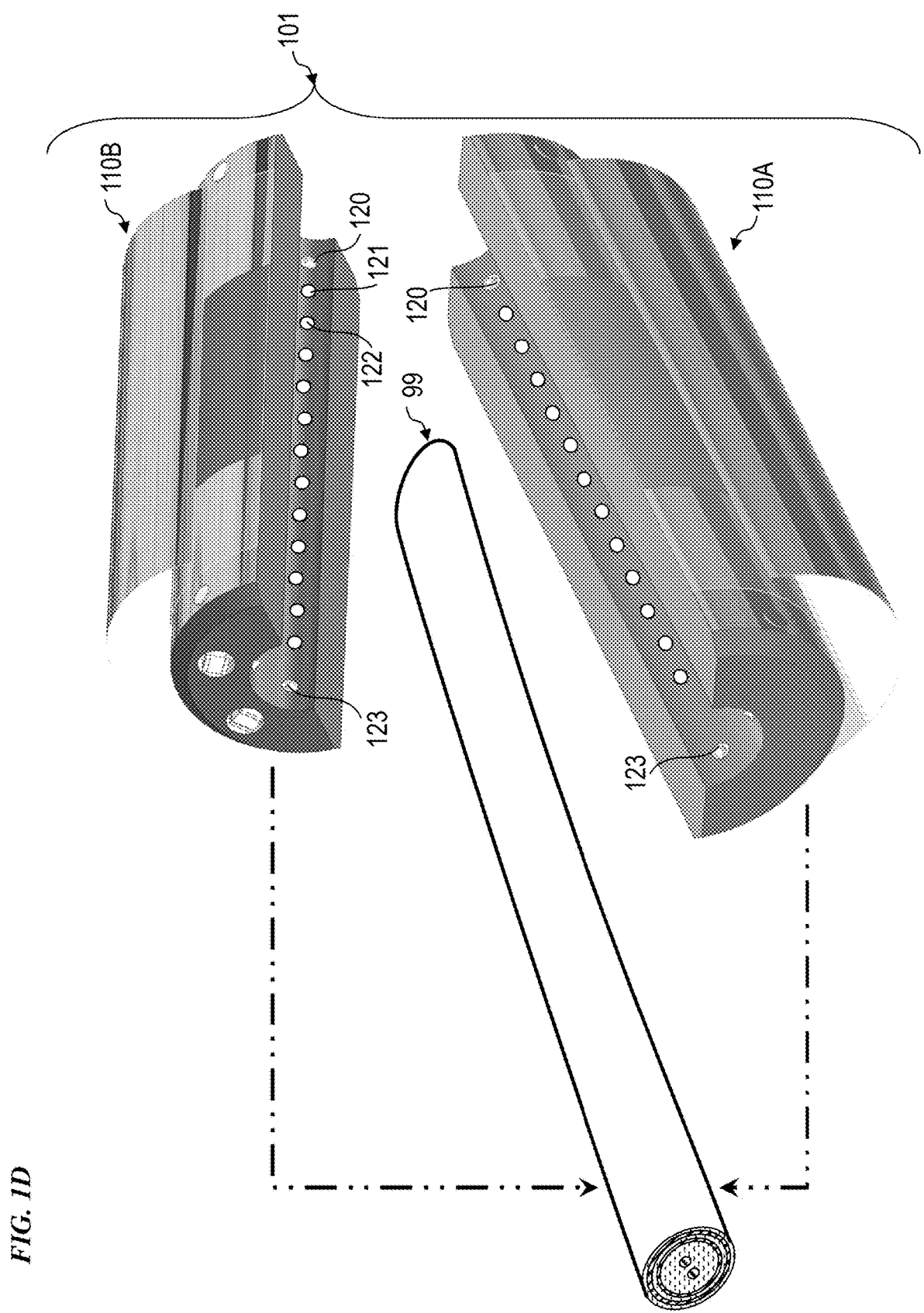
FIG. 1D is a perspective-view computer-model image of RF trap apparatus 101, according to some embodiments of the present invention.

FIG. 1D is a perspective-view computer-model image of RF trap apparatus 101, according to some embodiments of the present invention. In some embodiments, RF trap apparatus 101 includes a two-part split balun kit that includes 110A and 110B, each of which includes a series of crimpable projections 120, 121, 122, . . . 123.

Figure 2A:
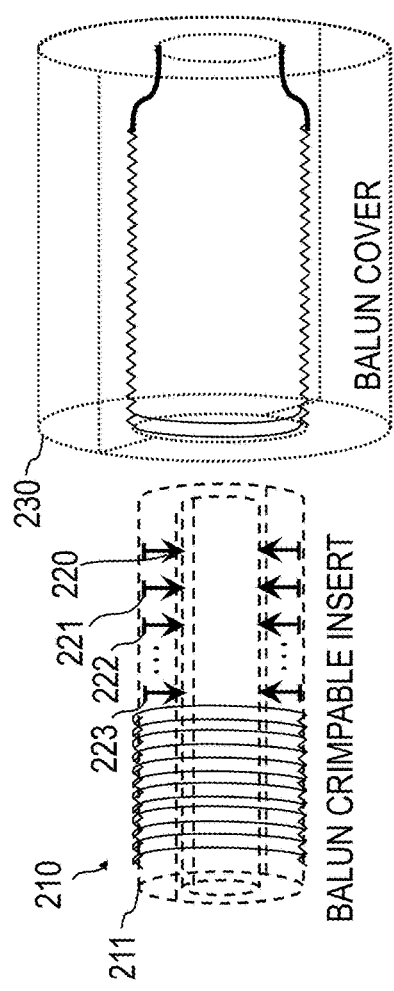
FIG. 2A is a block diagram of RF trap apparatus 201, according to some embodiments of the present invention.

FIG. 2A is a block diagram of RF trap apparatus kit 201, according to some embodiments of the present invention. In some embodiments, kit 201 includes a crimpable balun insert 210 that includes a plurality of withdrawn piercing conductive projections 220, 221, 222, . . . 223 held in a deformable insulator 211.

In some embodiments, threaded balun cover 230 slips over triax cable 99 from the end, and then crimpable balun insert 210 slips over triax cable 99 from the end (or threaded balun cover 230 is preassembled to crimpable balun insert 210 and both slip over triax cable 99 from the end).

In some other embodiments, threaded balun cover 230 is split in two parts such as shown in FIG. 1D and these two parts fit over triax cable 99 from the sides, and similarly crimpable balun insert 210 is split in two parts such as shown in FIG. 1D and these two parts fit over triax cable 99 from the sides.

By fitting crimpable balun insert 210 over triax cable 99 (see FIG. 2B) and squeezing crimpable balun insert 210 with a threaded balun cover 230 that automatically causes crimping to the predetermined depth needed to short the outer shield to the inner shield without going too far in (which would cause shorting to the innermost conductor 96) at selected locations, a conductive path is formed between the outer shield and the inner shield. When this electrical connection is made at a length of ¼ wavelength from the end of the outer shield 92 (optionally plus an integer number of ½ wavelengths), stray RF currents are trapped in the end portion of the outer shield 92 (to the left of the connection 220' of FIG. 2C). By providing a plurality of such projections at different positions from the end, a user can successively crimp additional projections, forming electrical shorts at progressively different lengths from the end of the outer shield, thus adjusting the electrical length of that end section until it is at the correct wavelength (as that wavelength is seen in the cable outer shield) of the RF frequency of interest.

Figure 2B:
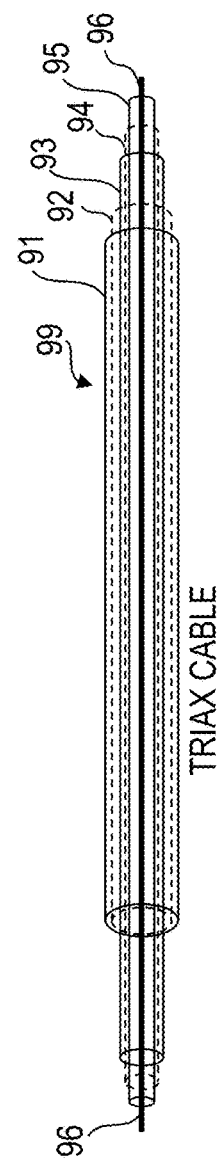
FIG. 2B is a block diagram of a triax shielded cable 99.

FIG. 2B is a block diagram of triax cable 99 that can be used with device 210 and 230 to form a balun 291, according to some embodiments of the present invention.

Figure 2C:
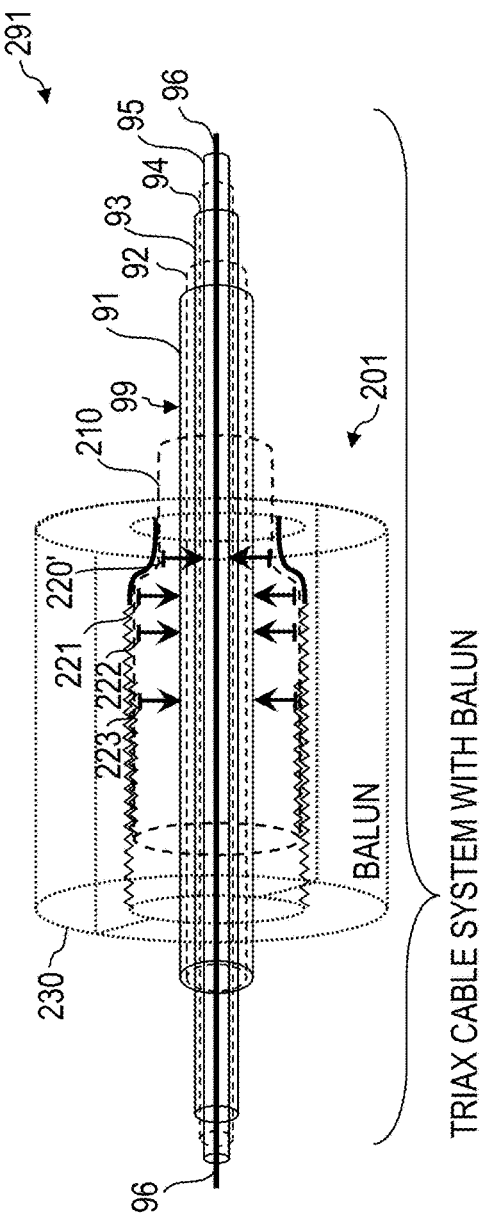
FIG. 2C is a block diagram of an RF trap system 291 that uses an RF trap apparatus 201 on a shielded cable 99, according to some embodiments of the present invention.

FIG. 2C is a block diagram of an RF trap system 291 that uses an RF trap apparatus 201 on a shielded cable 99, according to some embodiments of the present invention. In some embodiments, cable 99 includes one or more inner conductors 93 covered with insulator layer 94, and a conductive shield 92 surrounding the insulator layer 94, and an outer insulator layer 91 surrounding the shield 92. In some embodiments, RF trap 201 includes a plurality of possible connections, where here connection from crimped projections 220' has been made by crimping those connectors but not yet crimping projections 221, 222, . . . 223. If the initial connection via crimped projections 220' are not short enough to be at ¼ wavelength, then the user will crimp through additional projections, until the proper length is determined.

Figure 3A:
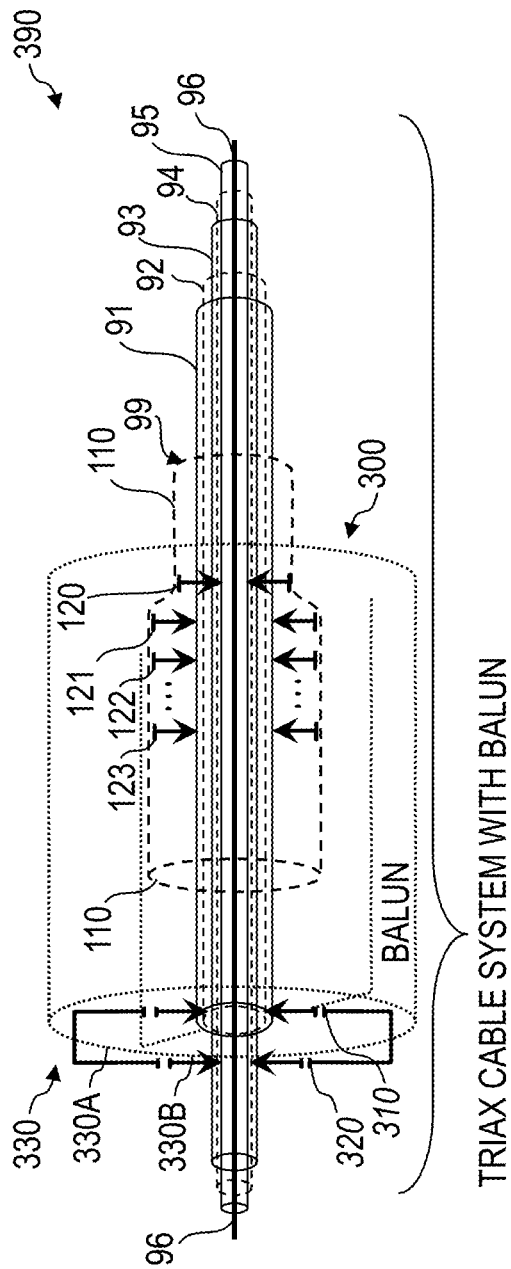
FIG. 3A is a block diagram of an RF trap system 390 that uses an RF trap apparatus 300 on a shielded cable 99, according to some embodiments of the present invention.

FIG. 3A is block diagram of an RF trap system 391 includes balun system 330 that includes 330A and 330B, each of which includes a series of crimpable projections 120, 121, 122, . . . 123 such as were shown in FIG. 1A. In this embodiment, the addition of optional reactance (capacitor and/or inductor) elements 320 and 310 (in this particular case, two capacitances) in series (as shown here) or in parallel (not shown) connections between the far ends of the outer conductor 92 and inner conductor 94 allow additional adjustment of the electrical length of the balun (for example, for fine tuning or for adjusting a length that is too short by accidentally crimping too many crimpable projections 121, 122, . . . 123) and/or allow tuning of multiple frequencies.

In each of the embodiments shown herein, the LC circuits shown can be replaced by one or more of the LC networks shown in the others of the Figures. In some such embodiments, a plurality of such L, C, and transmission line elements are combined to achieve the desired trapping of RF currents on the outer surface of the shield of the shielded cable.

FIG. 3B1 is a block diagram of an RF trap system 391 that uses an RF trap apparatus 301 on a shielded cable 99, according to some embodiments of the present invention. In this embodiment, the addition of capacitor element 310 in series with inductor element 320 (as shown here) or in parallel (not shown) connections between the far ends of the outer conductor 92 and inner conductor 94 allow additional adjustment of the electrical length of the balun and/or allow tuning of multiple frequencies.

Figure 3A:
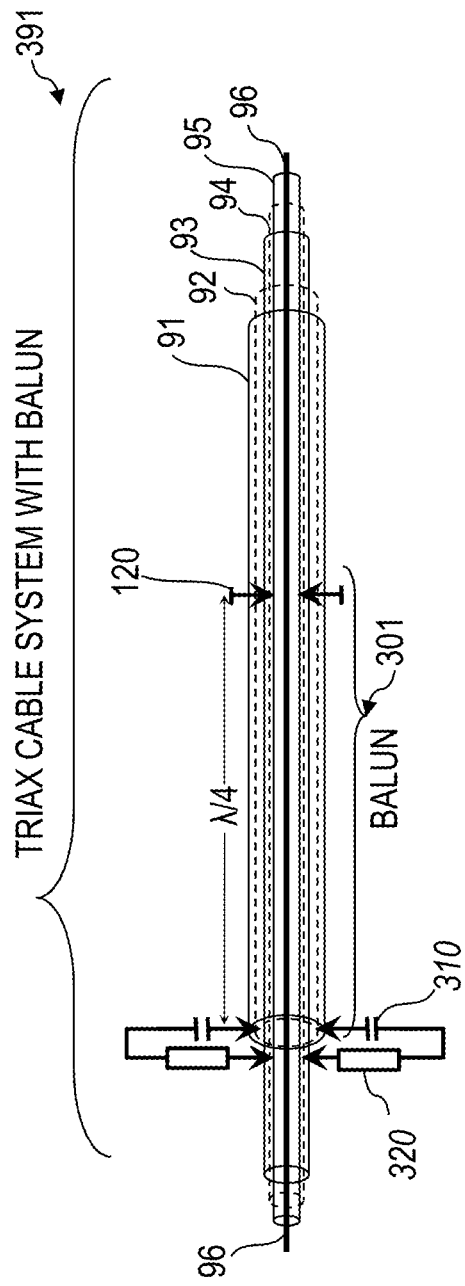

FIG. 3B2 is a block diagram of an RF trap system 392 that uses an RF trap apparatus 302 on a shielded cable 99, according to some embodiments of the present invention. In some embodiments, RF trap system 392 includes a capacitor element 310 in parallel with inductor element 320 (as shown here) (or, in other embodiments, in parallel, not shown) connected between the far ends of the outer conductor 92 at connection 336 and inner conductor 94 at connection 332, all within a sleeve 332 that is affixed on cable 99 allow additional adjustment of the electrical length of the balun and/or allow tuning of multiple frequencies. In some embodiments, variable reactance elements 310 and/or 320 are adjustable to tune to the appropriate frequencies. In some embodiments, a plurality of series-connected LC elements are connected in parallel between connections 334 and 336 to tune each of a plurality of frequencies of interest, FIG. 3B3 is a block diagram of an RF trap system 393 that uses an RF trap apparatus 303 on a shielded cable 99, according to some embodiments of the present invention. In some embodiments, system 393 includes a balun enclosure 340 having a plurality of preformed threaded holes 342 therethrough for receiving electrically conductive screws 343 at selected spacings such that screws 343 in holes 342 form shorts between outer conductor 92 and inner conductor 94. By successively inserting a screw at a time and making measurements of the frequency response (e.g., using a network analyzer having a Smith-chart display), the user can tune to the desired ¼ wavelength.

Ideally, the connection between the inner and outer shields is at ¼ wave electrically to generate the highest impedance to block shield currents. However, when one is unsure where $\lambda/4$ is located, one can, using the present invention, use successively applied multiple connections between the two shields along the length of the cable. The connections can be made sequentially with measurements made each time until the desired frequency response is achieved.

FIGS. 3C1, 3C1 and 3C3 provide a description and drawings of the present invention, according to some embodiments of the present invention.

Figure 3D:
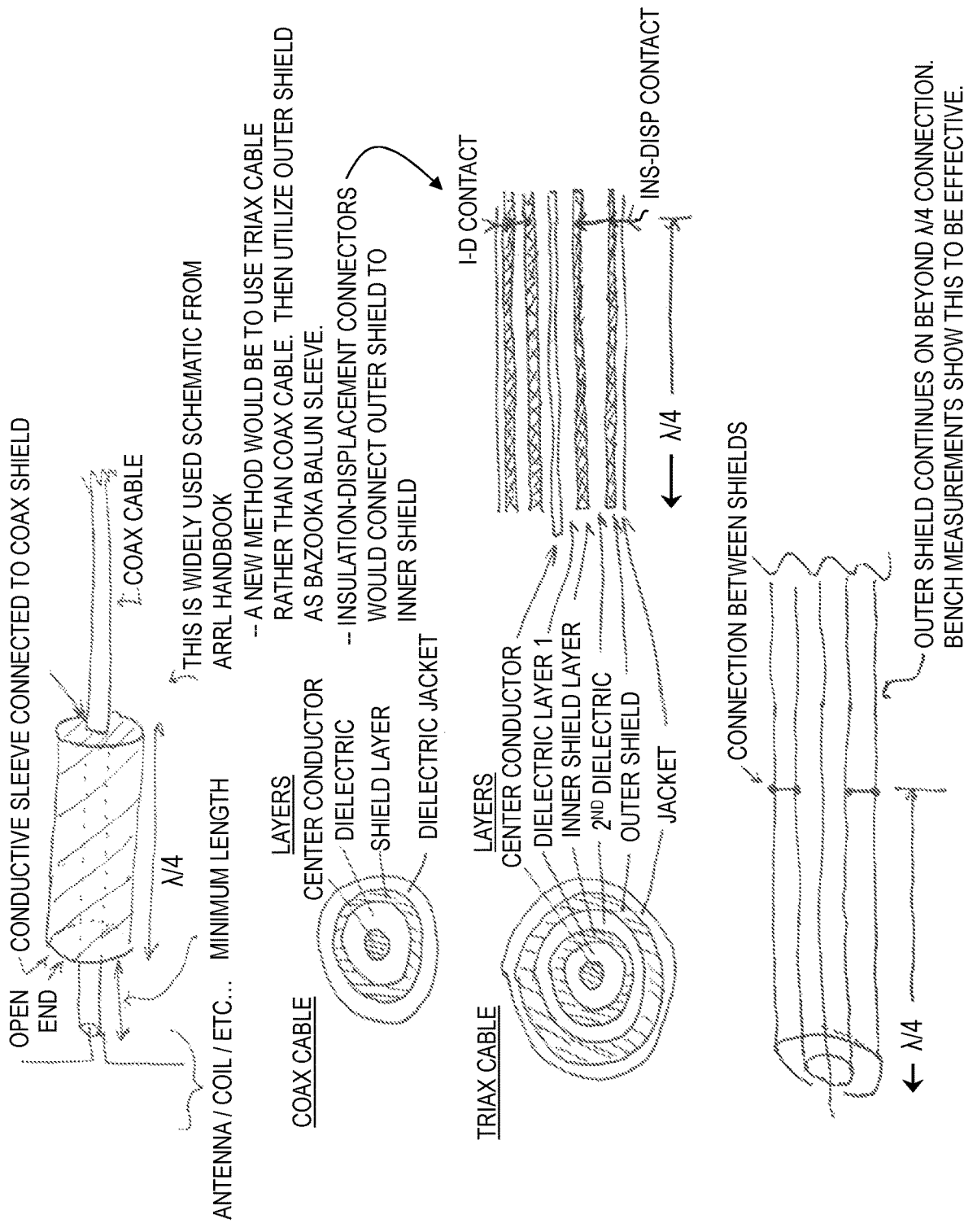
FIG. 3D is a description and drawings of the present invention, according to some embodiments of the present invention.

FIG. 3D is a description and drawings of the present invention, according to some embodiments of the present invention.

FIG. 3E is a description and drawings of the present invention, according to some embodiments of the present invention.

Bazooka balun link: www.antenna-theory.com/definitions/bazooka.php or one can google "bazooka balun" and see plenty of images showing the application of an outer metal sleeve being connected to the original coax shield at ¼ wave; like the following figure shows. The bazooka balun is an old technique that is displayed in the ARRL handbook. The new invention uses an arbitrarily longer sleeve, and the insulation-displacement or solder connection at ¼ wave. The inventor has demonstrated on the bench that the outer sleeve can be essentially arbitrarily long and still work, as long as the sleeve is attached at the appropriate ¼%-wave position (or any additional ½ wave position beyond that: ¼-, ¾-, 5/4-, 7/4-wave . . . )

Smith-chart measurements for both traps, short vs. Long (soldered at ¼ wave), demonstrated similar results. In some embodiments, an insulation-displacement connector is used to stab into triax cable at the ¼-wave location to make this connection. This is similar to U.S. Pat. No. 9,160,295, but open ended. In some embodiments, the open end of the bazooka balun is shortened or lengthened and then some reactance (capacitance or inductor) is added across the gap from the outer sleeve to the coax shield.

In some embodiments, the system of the present invention includes an RF trap having an LC circuit with one or more adjustable elements (e.g., the inductance and/or capacitance is adjustable), and a plurality of piercing elements that can be successively used to short between and outer conductor and an inner conductor of a triaxial (triax) cable.

In some other embodiments, the adjustment mechanism includes one or more remotely controlled non-magnetic (e.g., piezoelectric) motors each adjusted by its own respective motor controller(s) and feedback circuit(s) to robotically move mechanical parts (levers, hoops, sheets of resilient elastic material, and the like) to achieve robotic control of a piercing system for use within the high-field or sensitive-field environment in which the RLC and/or shield-shorting balun elements are adjusted by their own respective motor controllers and feedback circuits. In some such embodiments, the system sets an initial set of parameters (for example, resistance, inductance, capacitance, dielectric shape, frequency, phase, gain/attenuation, temporal properties, spatial properties (the shape of magnetic or electric fields), pulse width, mechanical position and orientation, or other controlled parameter) and a feedback circuit senses the result (one or more characteristics or parameters) and automatically adjusts the components (for example, variable resistors, inductors, capacitors, antennas, dielectric shapes, mechanical positioners and the like) in the system to compensate or control the system to achieve a desired result (e.g., a radar signal, magnetic-resonance or electron-spin image, or other desired system output).

In some embodiments, the one or more non-magnetic (e.g., piezoelectric) motors actuate control over electrical switches, amplitude modulators, frequency controllers, phase controllers, gain controllers, frequency modulators and the like by using, for example, control of variable resistor(s), inductor(s), capacitor(s), antenna(s), dielectric shape(s), mechanical positioner(s) and the like.

In some embodiments, the system uses non-magnetic (e.g., piezoelectric) motors (or other mechanical-movement devices) that include linear actuators, rotary actuators, pumps (pneumatic (pressure or vacuum) and/or liquid pumps) and/or the like. In some embodiments, the system optionally includes non-magnetic sensors (e.g., using piezoelectric or other suitable technologies) that include linear strain gauges, rotary sensors, pressure or sound sensors (e.g., pneumatic (pressure or vacuum) and/or liquid), position sensors, light and image sensors, voltage or current sensors, and/or the like. In some embodiments, such actuator elements and/or sensor elements are used for remotely controlled robotic diagnosis and examination, surgery, biopsy, and the like in a medical environment (such as a magnetic-resonance machine).

In some embodiments, the present invention includes one or more of any one or more of the devices in any of the figures herein in a combined circuit that connects the described variable components, optionally including other conventional components.

In some embodiments, the present invention provides an RF trap for blocking stray signals on a shielded RF cable that has a peripheral shield conductor, an inner shield conductor, and at least one inner conductor for carrying RF signals, the RF trap including: a case; and one or more piercing elements configured to be moved to selectively form an electrical connection between the peripheral shield conductor and the inner shield conductor. Some embodiments further include an LC circuit that is mounted to the case and that has a resonance frequency at a frequency of RF signals carried on the at least one inner conductor; a piercing structure electrically connected to the LC circuit and configured to pierce and electrically connect the LC circuit to the peripheral shield conductor and to the inner shield conductor of the shielded RF cable; and an attachment device configured to hold the case to the shielded RF cable with the LC circuit electrically connected to the shield conductor of the shielded RF cable.

In some embodiments, the present invention provides an RF-trap apparatus for blocking stray signals on a shielded RF cable that has a peripheral shield conductor, an inner shield conductor, and at least one inner conductor for carrying RF signals. This RF trap apparatus includes: an outer threaded balun cover; and an inner crimpable balun insert 210 that includes a plurality of withdrawn piercing conductive projections 220, 221, 222, . . . 223 held in a deformable insulator 211. The one or more piercing elements are configured to be moved to selectively form an electrical connection between the peripheral shield conductor and the inner shield conductor. Some embodiments further include an LC circuit that is mounted to the case and that has a resonance frequency at a frequency of RF signals carried on the at least one inner conductor; a plurality of projections electrically connected to the LC circuit and configured to pierce and electrically connect the LC circuit to the shield conductor of the shielded RF cable; and an attachment device configured to hold the case to the shielded RF cable with the LC circuit electrically connected to the shield conductor of the shielded RF cable.

Some embodiments further include an automatic parameter-adjustment unit operatively coupled to the LC circuit and configured to adjust electrical parameters of the LC circuit to control the resonance frequency of the LC circuit.

Some embodiments further include an automatic parameter-adjustment unit that has a non-magnetic mechanical actuator operatively coupled to the LC circuit and configured to adjust electrical parameters of the LC circuit to control the resonance frequency of the LC circuit.

In some embodiments, the plurality of projections electrically connected to the LC circuit include a first plurality of pointed projections at a first end of the case and a second plurality of pointed projections at a second end of the case opposite the first.

In some embodiments, the plurality of projections electrically connected to the LC circuit include a first plurality of pointed projections at a first end of the case and a second plurality of pointed projections at a second end of the case opposite the first, wherein each one of the first plurality of pointed projections is capacitively coupled to a cylindrical conductor spaced apart from the shield conductor of the shielded RF cable, and wherein each one of the second plurality of pointed projections is capacitively coupled to the cylindrical conductor.

In some embodiments, the plurality of projections electrically connected to the LC circuit include a first plurality of pointed projections only at a first end of the case and no pointed projections at a second end of the case opposite the first, and the LC circuit includes a conductive cylinder that is electrically connected to first plurality of pointed projections only at a first end of the case.

In some embodiments, the LC circuit includes a plurality of pi networks arranged at different radial directions around the shielded RF cable.

In some embodiments, the LC circuit includes a plurality of Tee networks arranged at different radial directions around the shielded RF cable.

In some embodiments, the LC circuit includes a plurality of quad-coupler networks arranged at different radial directions around the shielded RF cable.

In some embodiments, the LC circuit includes a plurality of Wilkenson power-splitter-combiner networks arranged at different radial directions around the shielded RF cable.

In some embodiments, the LC circuit includes a plurality of rat-race-coupler networks arranged at different radial directions around the shielded RF cable.

In some embodiments, the present invention provides a method that includes: providing a case having an LC circuit that is mounted to the case and that has a resonance frequency at a frequency of RF signals carried on the at least one inner conductor; a piercing structure electrically connected to the LC circuit and configured to pierce and electrically connect the LC circuit to the shield conductor of the shielded RF cable; and an attachment device configured to hold the case to the shielded RF cable with the LC circuit electrically connected to the shield conductor of the shielded RF cable.

Some embodiments further include automatically adjusting electrical parameters of the LC circuit to adjust the resonance frequency.

Some embodiments further include automatically adjusting electrical parameters of the LC circuit to adjust the resonance frequency by moving a non-magnetic mechanical-movement device.

In some embodiments of the method, the plurality of projections electrically connected to the LC circuit include a first plurality of pointed projections at a first end of the case and a second plurality of pointed projections at a second end of the case opposite the first.

In some embodiments of the method, the plurality of projections electrically connected to the LC circuit include a first plurality of pointed projections at a first end of the case and a second plurality of pointed projections at a second end of the case opposite the first, wherein each one of the first plurality of pointed projections is capacitively coupled to a cylindrical conductor spaced apart from the shield conductor of the shielded RF cable, and wherein each one of the second plurality of pointed projections is capacitively coupled to the cylindrical conductor.

In some embodiments of the method, the plurality of projections electrically connected to the LC circuit include a first plurality of pointed projections only at a first end of the case and no pointed projections at a second end of the case opposite the first, and the LC circuit includes a conductive cylinder that is electrically connected to first plurality of pointed projections only at a first end of the case.

In some embodiments of the method, the LC circuit includes a plurality of pi networks arranged at different radial directions around the shielded RF cable.

In some embodiments, the LC circuit includes a plurality of Tee networks arranged at different radial directions around the shielded RF cable.

In some embodiments of the method, the LC circuit includes a plurality of quad-coupler networks arranged at different radial directions around the shielded RF cable.

In some embodiments of the method, the LC circuit includes a plurality of Wilkenson power-splitter-combiner networks arranged at different radial directions around the shielded RF cable.

In some embodiments of the method, the LC circuit includes a plurality of rat-race-coupler networks arranged at different radial directions around the shielded RF cable.

In some embodiments, the present invention provides a non-transitory computer-readable medium having instructions stored thereon for causing a suitably programmed information processor to execute a method that comprises: autocontrolling an electrical parameter of an LC circuit that is mounted to a case of a snap-on balun attached to a shielded RF cable that has a peripheral shield conductor and at least one inner conductor for carrying RF signals, wherein the LC circuit has a resonance frequency at a frequency of RF signals carried on the at least one inner conductor, wherein the case includes a piercing structure electrically connected to the LC circuit and configured to pierce and electrically connect the LC circuit to the shield conductor of the shielded RF cable.

In some embodiments of the computer-readable medium, the method further includes using a feedback signal operatively coupled to the programmable information-processing device to provide feedback control in order to maintain the electrical parameter of the LC circuit.

In some embodiments of the computer-readable medium, the method further includes controlling resistance, inductance and capacitance (RLC) values of the LC circuit.

In some embodiments, the present invention provides an RF-trap apparatus for blocking stray signals on a shielded RF cable that has two or more concentric peripheral shield conductors and at least one inner conductor for carrying RF signals, the RF trap apparatus including: a case (e.g., 110 or 210); a plurality of projections configured to selectively electrically connect an outer shield conductor to an inner shield conductor by a pierce operation on the doubly shielded RF cable; and an attachment configured to hold the case to the shielded RF cable with the pierce projections connected to the outer and inner shield conductors of the shielded RF cable.

In some embodiments, the attachment includes an outer cover (e.g., 130 or 230) configured to be placed over the case to hold the case in place.

In some embodiments, the case has a plurality of portions (e.g., 110A and 110B as shown in FIG. 1D, or 210 made of two or more such parts) that fit together around the cable, and wherein the case is crimpable to selectively force the pierce projections through the outer and inner shield conductors.

In some embodiments, the attachment includes an outer cover 230 configured to be placed over the case to hold the case in place, and wherein the outer cover has a threaded inner surface; and wherein the case has a plurality of portions that fit together around the cable, and wherein the case has a threaded outer surface that mates with the threaded inner surface of the cover, and is crimpable by rotating the outer cover relative to the case to selectively force the pierce projections (e.g., 220, 221, 222, 223) through the outer and inner shield conductors.

In some embodiments, the present invention provides an RF-trap apparatus for blocking stray signals on a shielded RF cable that has two or more concentric peripheral shield conductors separated from one another by one or more electrically insulating layers, and at least one inner conductor for carrying RF signals. The RF trap apparatus includes: a first housing; and a plurality of projections configured be coupled to the first housing and to move to selectively electrically connect an outer shield conductor to an inner shield conductor by a pierce operation on the shielded RF cable.

Some embodiments further include a cover configured to hold the first housing to the shielded RF cable with the pierce projections connected to the outer and inner shield conductors of the shielded RF cable.

Some embodiments further include a cover configured to hold the first housing to the shielded RF cable with the pierce projections connected to the outer and inner shield conductors of the shielded RF cable, wherein the cover is configured to be placed over the first housing to hold the first housing in place.

In some embodiments of the apparatus, the first housing has a plurality of portions that fit together around the cable from the side of the cable, and wherein the first housing is crimpable to selectively force the pierce projections through the outer and inner shield conductors.

Some embodiments further include a cover configured to hold the first housing to the shielded RF cable with the pierce projections connected to the outer and inner shield conductors of the shielded RF cable, wherein the cover is configured to be placed over the first housing to hold the first housing in place, wherein the cover has a threaded inner surface and wherein the first housing has a plurality of portions that fit together around the cable, and wherein the first housing has a threaded outer surface that mates with the threaded inner surface of the cover, and is crimpable by rotating the cover relative to the first housing to selectively force the pierce projections through the outer and inner shield conductors.

Some embodiments further include a cover configured to hold the first housing to the shielded RF cable with the pierce projections connected to the outer and inner shield conductors of the shielded RF cable, wherein the cover is configured to be placed over the first housing to hold the first housing in place, wherein the cover has a threaded inner surface, and wherein the first housing has a plurality of portions that fit together around the cable, and wherein the first housing has a threaded outer surface that mates with the threaded inner surface of the cover, and is crimpable by rotating the cover relative to the first housing to selectively force the pierce projections through the outer and inner shield conductors.

In some embodiments of the apparatus, the first housing has a plurality of threaded holes extending radially therethrough, and wherein the plurality of projections configured be coupled to the first housing include screws configured to be screwed into the threaded holes of the first housing to selectively electrically connect an outer shield conductor to an inner shield conductor by a pierce operation into the shielded RF cable.

In some embodiments, the present invention provides an RF-trap method for blocking stray signals on a shielded RF cable that has an outer shield conductor concentrically surrounding an inner shield conductor separated from one another by one or more electrically insulating layers, and at least one inner conductor for carrying RF signals by one or more electrically insulating layers inside the inner shield conductor. This RF trap method includes: providing a first housing having a plurality of piercing projections; attaching the first housing to the shielded RF cable; and forcing a plurality of the piercing projections of the first housing to pierce the shielded RF cable and electrically connect an outer shield conductor to an inner shield conductor.

Some embodiments of the method further include providing a cover; and holding the first housing to the shielded RF cable with the cover so the pierce projections connect the outer and inner shield conductors of the shielded RF cable to one another.

Some embodiments of the method further include providing a cover; placing the first housing on the shielded RF cable; placing the cover on the first housing; and crimping successive portions of the first housing to pierce the shielded RF cable by forcing the outer successively onto the successive portions of the first housing so the pierce projections connect the outer and inner shield conductors of the shielded RF cable to one another, wherein the outer is configured to be placed over the first housing after the first housing is placed on the shielded cable to hold the first housing in place.

In some embodiments of the method, the first housing has a plurality of portions that fit together around the cable, and wherein the first housing is crimpable to selectively force the pierce projections through the outer and inner shield conductors.

Some embodiments of the method further include providing a cover, wherein the cover has a threaded inner surface, wherein the first housing has a threaded outer surface that mates with the threaded inner surface of the cover, and wherein the first housing has a plurality of portions that fit together around the cable from the side and is crimpable by rotating the cover relative to the first housing to selectively force the pierce projections through the outer and inner shield conductors; placing the cover over the first housing to hold the first housing in place; and threading the cover onto the first housing to force selected ones of the pierce projections to electrically connect the outer and inner shield conductors of the shielded RF cable to one another.

Some embodiments of the method further include providing a cover configured to hold the first housing to the shielded RF cable with the pierce projections connected to the outer and inner shield conductors of the shielded RF cable, wherein the cover is configured to be placed over the first housing to hold the first housing in place, wherein the cover has a threaded inner surface, and wherein the first housing has a plurality of portions that fit together around the cable from a side of the cable, and wherein the first housing has a threaded outer surface that mates with the threaded inner surface of the cover; and crimping the first housing by rotating the cover relative to the first housing to selectively force the pierce projections through the outer and inner shield conductors.

In some embodiments, the first housing has a plurality of threaded holes extending radially therethrough, and wherein the plurality of projections configured be coupled to the first housing are screws; and the method further includes successively screwing selected ones of the screws into the threaded holes of the first housing to selectively electrically connect an outer shield conductor to an inner shield conductor.

In some embodiments, the present invention provides an RF-trap apparatus for blocking stray signals on a shielded RF cable that has an outer shield conductor concentrically surrounding an inner shield conductor separated from one another by one or more electrically insulating layers, and at least one inner conductor for carrying RF signals by one or more electrically insulating layers inside the inner shield conductor. This RF trap apparatus includes: a first housing having a plurality of piercing projections; means for attaching the first housing to the shielded RF cable; means for forcing a plurality of the piercing projections of the first housing to pierce the shielded RF cable and electrically connect an outer shield conductor to an inner shield conductor.

Some embodiments further include a cover; and means for holding the first housing to the shielded RF cable with the cover so the pierce projections connect the outer and inner shield conductors of the shielded RF cable to one another.

Some embodiments further include means for crimping successive portions of the first housing to pierce the shielded RF cable by forcing the outer successively onto the successive portions of the first housing so the pierce projections connect the outer and inner shield conductors of the shielded RF cable to one another, wherein the outer is configured to be placed over the first housing after the first housing is placed on the shielded cable to hold the first housing in place.

In some embodiments, the first housing has a plurality of portions that fit together around the cable, and wherein the first housing is crimpable to selectively force the pierce projections through the outer and inner shield conductors.

Some embodiments further include a cover; and means for threading the cover onto the first housing to force selected ones of the pierce projections to electrically connect the outer and inner shield conductors of the shielded RF cable to one another.

In some embodiments, the plurality of projections are screws.

It is to be understood that the above description is intended to be illustrative, and not restrictive. Although numerous characteristics and advantages of various embodiments as described herein have been set forth in the foregoing description, together with details of the structure and function of various embodiments, many other embodiments and changes to details will be apparent to those of skill in the art upon reviewing the above description. The scope of the invention should be, therefore, determined with reference to the appended claims, along with the full scope of equivalents to which such claims are entitled. In the appended claims, the terms "including" and "in which" are used as the plain-English equivalents of the respective terms "comprising" and "wherein," respectively. Moreover, the terms "first," " "second," and "third," etc., are used merely as labels, and are not intended to impose numerical requirements on their objects.

What is claimed is:

1. An RF-trap apparatus for blocking stray signals on a shielded RF cable that has two or more concentric peripheral shield conductors separated from one another by one or more electrically insulating layers, and at least one inner conductor for carrying RF signals, wherein the two or more concentric peripheral shield conductors include an inner shield conductor and an outer shield conductor, the RF trap apparatus comprising:
a first housing; and
a plurality of projections configured to be coupled to the first housing and to move to selectively electrically connect the outer shield conductor to the inner shield conductor by a pierce operation on the shielded RF cable.

2. The apparatus of claim 1, further comprising:
a cover configured to hold the first housing to the shielded RF cable with the plurality of projections connected to the outer and inner shield conductors of the shielded RF cable.

3. The apparatus of claim 1, further comprising:
a cover configured to hold the first housing to the shielded RF cable with the plurality of projections connected to the outer and inner shield conductors of the shielded RF cable, wherein the cover is configured to be placed over the first housing to hold the first housing in place.

4. The apparatus of claim 1, wherein the first housing has a plurality of portions that fit together around the shielded RF cable from a side of the shielded RF cable, and wherein the first housing is crimpable to selectively force the plurality of projections through the outer and inner shield conductors.

5. The apparatus of claim 1, further comprising:
a cover configured to hold the first housing to the shielded RF cable with the plurality of projections connected to the outer and inner shield conductors of the shielded RF cable, wherein the cover is configured to be placed over the first housing to hold the first housing in place, and wherein the cover has a threaded inner surface; and
wherein the first housing has a plurality of portions that fit together around the cable, and wherein the first housing has a threaded outer surface that mates with the threaded inner surface of the cover, and is crimpable by rotating the cover relative to the first housing to selectively force the plurality of projections through the outer and inner shield conductors.

6. The apparatus of claim 1, wherein the first housing has a plurality of threaded holes extending radially therethrough, and wherein the plurality of projections configured to be coupled to the first housing include screws configured to be screwed into the threaded holes of the first housing to selectively electrically connect the outer shield conductor to the inner shield conductor by the pierce operation into the shielded RF cable.

7. An RF-trap method for blocking stray signals on a shielded RF cable that has an outer shield conductor concentrically surrounding an inner shield conductor separated from one another by one or more electrically insulating layers, and at least one inner conductor for carrying RF signals by one or more electrically insulating layers inside the inner shield conductor, the RF trap method comprising:
providing a first housing having a plurality of piercing projections;
attaching the first housing to the shielded RF cable; and
forcing the plurality of piercing projections of the first housing to pierce the shielded RF cable and electrically connect the outer shield conductor to the inner shield conductor.

8. The method of claim 7, wherein the first housing has a plurality of threaded holes extending radially therethrough, and wherein the plurality of projections configured to be coupled to the first housing are screws; the method including:
successively screwing selected ones of the screws into the threaded holes of the first housing to selectively electrically connect the outer shield conductor to the inner shield conductor.

9. The method of claim 7, further comprising:
providing a cover; and
holding the first housing to the shielded RF cable with the cover so the plurality of piercing projections connect the outer and inner shield conductors of the shielded RF cable to one another.

10. The method of claim 7, further comprising:
providing a cover;
placing the first housing on the shielded RF cable; placing the cover on the first housing; and
crimping successive portions of the first housing to pierce the shielded RF cable by forcing the outer shield conductor successively onto the successive portions of the first housing so the plurality of pierce projections connect the outer and inner shield conductors of the shielded RF cable to one another, wherein the outer shield conductor is configured to be placed over the first housing after the first housing is placed on the shielded cable to hold the first housing in place.

11. The method of claim 7, wherein the first housing has a plurality of portions that fit together around the cable, and wherein the first housing is crimpable to selectively force the plurality of piercing projections through the outer and inner shield conductors.

12. The method of claim 7, further comprising:
providing a cover, wherein the cover has a threaded inner surface, wherein the first housing has a threaded outer surface that mates with the threaded inner surface of the cover, and wherein the first housing has a plurality of portions that fit together around the cable from a side and is crimpable by rotating the cover relative to the first housing to selectively force the plurality of piercing projections through the outer and inner shield conductors;
placing the cover over the first housing to hold the first housing in place; and
threading the cover onto the first housing to force selected ones of the plurality of piercing projections to electrically connect the outer and inner shield conductors of the shielded RF cable to one another.

13. The method of claim 7, further comprising:
providing a cover configured to hold the first housing to the shielded RF cable with the plurality of piercing projections connected to the outer and inner shield conductors of the shielded RF cable, wherein the cover is configured to be placed over the first housing to hold the first housing in place, wherein the cover has a threaded inner surface, and wherein the first housing has a plurality of portions that fit together around the cable from a side of the cable, and wherein the first housing has a threaded outer surface that mates with the threaded inner surface of the cover; and
crimping the first housing by rotating the cover relative to the first housing to selectively force the plurality of piercing projections through the outer and inner shield conductors.

14. An RF-trap apparatus for blocking stray signals on a shielded RF cable that has an outer shield conductor concentrically surrounding an inner shield conductor separated from one another by one or more electrically insulating layers, and at least one inner conductor for carrying RF signals by one or more electrically insulating layers inside the inner shield conductor, the RF trap apparatus comprising:
a first housing having a plurality of piercing projections;
means for attaching the first housing to the shielded RF cable; and
means for forcing the plurality of piercing projections of the first housing to pierce the shielded RF cable and electrically connect an outer shield conductor to an inner shield conductor.

15. The apparatus of claim 14, further comprising:
a cover having a threaded inner surface,
wherein the first housing has a plurality of portions that fit together around the cable, and wherein the first housing has a threaded outer surface that mates with the threaded inner surface of the cover.

16. The apparatus of claim 14, further comprising:
a cover; and
means for holding the first housing to the shielded RF cable with the cover so the plurality of piercing projections connect the outer and inner shield conductors of the shielded RF cable to one another.

17. The apparatus of claim 14, further comprising:
means for crimping successive portions of the first housing to pierce the shielded RF cable by forcing the outer shield conductor successively onto the successive portions of the first housing so the plurality of piercing projections connect the outer and inner shield conductors of the shielded RF cable to one another, wherein the outer shield conductor is configured to be placed over the first housing after the first housing is placed on the shielded cable to hold the first housing in place.

18. The apparatus of claim 14, wherein the first housing has a plurality of portions that fit together around the cable, and wherein the first housing is crimpable to selectively force the plurality of piercing projections through the outer and inner shield conductors.

19. The apparatus of claim 14, further comprising:
a cover; and
means for threading the cover onto the first housing to force selected ones of the plurality of piercing projections to electrically connect the outer and inner shield conductors of the shielded RF cable to one another.

20. The apparatus of claim 14, wherein the plurality of piercing projections are screws.

\* \* \* \* \*